(12) United States Patent
Ge et al.

(10) Patent No.: US 9,917,030 B2
(45) Date of Patent: Mar. 13, 2018

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Hong Tao Ge, Shanghai (CN); Xiao Yan Bao, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/401,134

(22) Filed: Jan. 9, 2017

(65) Prior Publication Data

US 2017/0229367 A1   Aug. 10, 2017

(30) Foreign Application Priority Data

Feb. 4, 2016 (CN) .......................... 2016 1 0080796

(51) Int. Cl.
  *H01L 23/367* (2006.01)
  *H01L 27/12* (2006.01)
  (Continued)

(52) U.S. Cl.
  CPC ...... *H01L 23/3672* (2013.01); *H01L 21/4882* (2013.01); *H01L 21/76802* (2013.01);
  (Continued)

(58) Field of Classification Search
  CPC ....................... H01L 23/3672; H01L 23/3738
  See application file for complete search history.

(56) References Cited

U.S. PATENT DOCUMENTS

| | | | |
|---|---|---|---|
| 5,313,094 A * | 5/1994 | Beyer | H01L 23/3178 257/622 |
| 6,071,803 A * | 6/2000 | Rutten | H01L 21/84 257/E21.703 |

(Continued)

FOREIGN PATENT DOCUMENTS

| JP | S61144037 A | 7/1986 |
|---|---|---|
| WO | 2013067572 A1 | 5/2013 |

OTHER PUBLICATIONS

The European Patent Office (EPO) The Extended European Search Report for 17153091.8 Jun. 6, 2017 8 Pages.

*Primary Examiner* — Earl Taylor
(74) *Attorney, Agent, or Firm* — Anova Law Group, PLLC

(57) ABSTRACT

The present disclosure provides semiconductor structures and fabrication methods thereof. An exemplary semiconductor structure includes an insulation material layer having a top semiconductor layer having transistor regions formed on a top surface of the insulation material layer; isolation structures formed in the top semiconductor layer between adjacent transistor regions; a first dielectric layer formed over the top semiconductor layer; a first heat-conducting layer having a thermal conductivity higher than a thermal conductivity of the isolation structure and passing through the insulation material layer, the top semiconductor layer and the first dielectric layer; a second dielectric layer formed over the first dielectric layer; an interconnect structure formed in the second dielectric layer; and a bottom layer conductive via passing through the heat-conducting layer (Continued)

and a partial thickness of the second dielectric layer, and electrically connected with the interconnect structure.

20 Claims, 7 Drawing Sheets

(51) Int. Cl.
    *H01L 23/373*    (2006.01)
    *H01L 23/522*    (2006.01)
    *H01L 21/84*     (2006.01)
    *H01L 21/48*     (2006.01)
    *H01L 21/768*    (2006.01)

(52) U.S. Cl.
    CPC ........ *H01L 21/76877* (2013.01); *H01L 21/84* (2013.01); *H01L 23/3738* (2013.01); *H01L 23/5226* (2013.01); *H01L 27/1203* (2013.01)

(56) References Cited

U.S. PATENT DOCUMENTS

| | | | | |
|---|---|---|---|---|
| 6,531,753 B1 * | 3/2003 | Lin | ............... | H01L 21/76251 257/347 |
| 6,573,565 B2 * | 6/2003 | Clevenger | ......... | H01L 21/76264 257/347 |
| 7,541,644 B2 * | 6/2009 | Hirano | ............... | H01L 21/8221 257/347 |
| 7,893,529 B2 * | 2/2011 | Hsu | ............... | H01L 23/481 136/203 |
| 8,227,840 B2 * | 7/2012 | Wang | ............... | H01L 23/481 257/276 |
| 8,466,054 B2 * | 6/2013 | Stuber | ............... | H01L 23/36 257/E21.122 |
| 8,598,636 B2 * | 12/2013 | Huang | ............... | H01L 23/38 257/256 |
| 9,029,201 B2 * | 5/2015 | Nygaard | ............... | H01L 21/78 438/122 |
| 9,034,732 B2 * | 5/2015 | Molin | ............... | H01L 21/84 257/506 |
| 9,059,269 B2 * | 6/2015 | Botula | ............... | H01L 29/78 |
| 9,099,540 B2 * | 8/2015 | Law | ............... | H01L 21/76898 |
| 9,390,974 B2 * | 7/2016 | Stuber | ............... | H01L 21/6835 |
| 9,412,644 B2 * | 8/2016 | Stuber | ............... | H01L 21/76251 |
| 9,466,719 B2 * | 10/2016 | Nygaard | ............... | H01L 21/78 |
| 9,496,227 B2 * | 11/2016 | Molin | ............... | H01L 23/562 |
| 9,530,798 B1 * | 12/2016 | Chou | ............... | H01L 27/1207 |
| 2002/0113288 A1 * | 8/2002 | Clevenger | ......... | H01L 21/76264 257/513 |
| 2003/0017650 A1 * | 1/2003 | Armbrust | ............... | H01L 23/3677 438/122 |
| 2004/0104452 A1 * | 6/2004 | Yamaguchi | ......... | H01L 23/3677 257/536 |
| 2004/0232554 A1 * | 11/2004 | Hirano | ............... | H01L 21/8221 257/758 |
| 2007/0096263 A1 * | 5/2007 | Furukawa | ......... | H01L 21/76898 257/621 |
| 2011/0140232 A1 * | 6/2011 | Gaul | ............... | H01L 21/76283 257/508 |
| 2014/0191322 A1 * | 7/2014 | Botula | ............... | H01L 29/78 257/347 |

* cited by examiner

SEMICONDUCTOR STRUCTURE AND FABRICATION METHOD THEREOF

CROSS-REFERENCES TO RELATED APPLICATIONS

This application claims the priority of Chinese patent application No. 201610080796.5, filed on Feb. 4, 2016, the entirety of which is incorporated herein by reference.

FIELD OF THE INVENTION

The present invention generally relates to the field of semiconductor manufacturing technology and, more particularly, relates to semiconductor structures and fabrication methods thereof.

BACKGROUND

With the rapid development of semiconductor technologies, the integrated circuits (ICs) have been developed toward high integration level, high speed and low power consumption. Bulk silicon substrates and bulk silicon devices formed by the bulk silicon techniques are approaching to the physical limitation. Thus, further reducing the critical dimension (CD) of the ICs has met certain challenges. Replacing the bulk silicon substrates and the bulk silicon devices with Silicon-on-Insulator (SOI) substrates and SOI devices is considered as one of the best approaches.

The SOI substrates are used for forming ICs. Comparing with the commonly used bulk silicon substrates, the SOI substrates have some advantages. For example, the ICs formed by the SOI substrates have smaller parasitic capacitances, higher integration level, smaller short channel effect, and faster speed. Further, using SOI substrates is able to achieve dielectric isolations in the devices in the ICs; and the latch-up effect of the ICs is eliminated.

Three-dimensional integrated circuits (3D ICs) are formed by advanced chip-stacking techniques. IC chips with different functions may be stacked into a 3D IC. Comparing with the two-dimensional (2D) ICs, the chip-stacking technique of the 3D ICs not only reduces the signal transmission path of the 3D ICs, but also increases the operation speed of the 3D ICs. Briefly, the stacking technique of the 3D ICs is able to meet certain requirements of semiconductor devices, including better performance, smaller size, lower power consumption, and more functions.

According to the connection methods of the chips in the 3D ICs, the interconnect technique of the stacked-IC chips includes a wire bonding method and a wafer bonding method. The wafer bonding method has a shorter electrical connection path than the wire bonding method; and is able to provide a better thermal property, a better electrical characteristic and a smaller structure size. Thus, the wafer bonding method is one of the most-researched techniques; and is used to achieve a temporary or permanent bonding between different chips.

The bonding type of the wafer bonding method includes the Si—Si direct bonding, the Si-glass static bonding, and the metal-metal bonding. The metal-metal bonding technique is one of the most important research fields. The metal-metal bonding technique bonds two wafers face-to-face by diffusion and/or metal melting between metals and/or between metal and the surface of the wafer through metal and/or metal alloys.

However, in the existing techniques, the electrical properties of the semiconductor structure, after bonding the semiconductor devices formed by the SOI wafer with other substrate or wafer, needs further improvements. The disclosed device structures and methods are directed to solve one or more problems set forth above and other problems in the art.

BRIEF SUMMARY OF THE DISCLOSURE

One aspect of the present disclosure includes a semiconductor structure. The semiconductor structure includes an insulation material layer having a top surface and a bottom surface; a top semiconductor layer having a plurality of transistor regions formed on the top surface of the insulation material layer; isolation structures formed in the top semiconductor layer between adjacent transistor regions; a first dielectric layer formed over the top semiconductor layer; a first heat-conducting layer, having a thermal conductivity higher than a thermal conductivity of the isolation structures, and passing through the insulation material layer, the isolation structure in the fop semiconductor layer, and the first dielectric layer; a second dielectric layer formed over the first dielectric layer; an interconnect structure formed in the second dielectric layer; and a bottom layer conductive via, passing through the first heat-conducting layer and a partial thickness of the second dielectric layer, and electrically connected with the interconnect structure.

Another aspect of the present disclosure includes a method for fabricating a semiconductor structure. The method includes providing a bottom semiconductor layer, an insulation material layer on the bottom semiconductor layer and a top semiconductor layer having a plurality of transistor regions on the insulation material layer; forming isolation structures between adjacent transistor regions; forming gate structures on the top semiconductor layer in the transistor regions; forming doping regions in the top semiconductor layer at two sides of the gate structures; forming a first dielectric layer over the top semiconductor layer; etching portions of the first dielectric layer, the top semiconductor layer and the insulation material layer between adjacent transistor regions until the bottom semiconductor layer is exposed to form a first opening; and forming a first heat-conducting layer having a thermal conductivity greater than a thermal conductivity of the isolation structure in the first opening.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
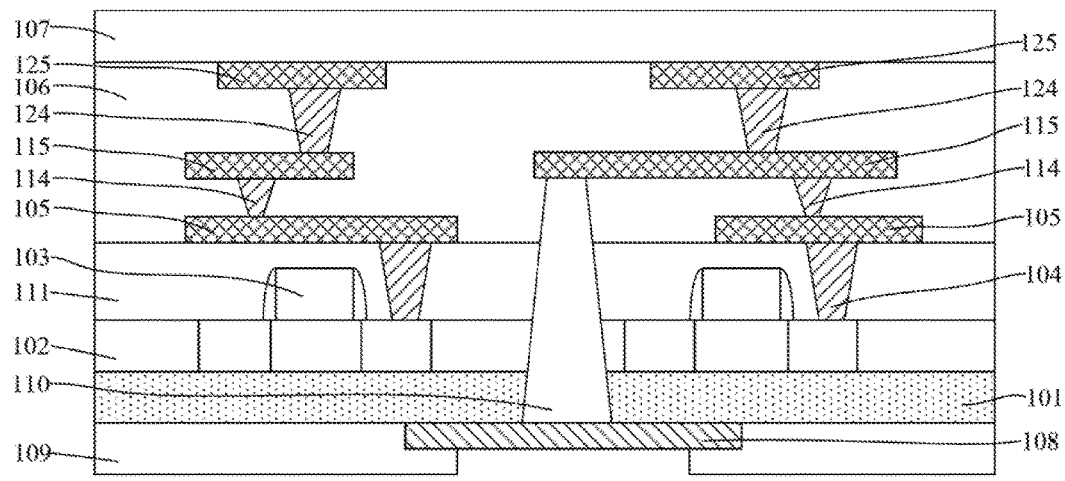
FIG. 1 illustrates a cross-sectional view of an existing semiconductor structure.

FIG. 1 illustrates the cross-sectional view of an existing semiconductor Structure. As shown in FIG. 1, the semiconductor structure includes an insulation material layer 101; a top semiconductor layer 102 on atop surface of the insulation material layer 101; gate structures 103 formed the portions of the surface of the top semiconductor layer 102, sidewall spacers (not labeled) formed on the side surfaces of the gate structures 103; source/drain regions (not shown) formed in the top semiconductor layer 102; a first dielectric layer 111 covering the gate structures 103 and the source/drain regions formed on the surface of the top semiconductor layer 102; first conductive vias 104 electrically connected with the source/drain regions formed in the first dielectric layer 111; and first metal layers 105 electrically connected with the conductive vias 104 formed on the first dielectric layer 111.

Further, the semiconductor also includes a dielectric layer 106 formed on the surface of the first dielectric layer 111; and an interconnect structure (not labeled electrically connected with the first metal 105 formed in the dielectric layer 106. In one example, the interconnect structure Includes two metal layers. Specifically, the interconnect structure includes second conductive vias 114 electrically connected with the first metal layer 105 above the first metal layer 105; a second metal layer 115 electrically connected with the second conductive vias 114 above the second conductive vias 114; third conductive vias 124 electrically connected with the second metal layer 115 above the second metal layer 115; and a top metal layer 125 electrically connected with the third conductive vias 124 above the third conductive vias 124. The dielectric layer 106 exposes the surface of the top metal layer 125.

The semiconductor structure also includes a carrier wafer 107 bonded with the surface of the dielectric layer 106. Further, the semiconductor structure also includes a through hole (not labeled) penetrating through the insulation material layer 101, the top semiconductor layer 102, the first dielectric layer 111 and a portion of the dielectric layer 106. The through hole exposes the surface of the second metal layer 115. A conductive layer 110 is filled in the through hole; and electrically connected with the second metal layer 115.

Further, the semiconductor structure also includes an electrode layer 108 formed on the bottom surface of the insulation material layer 101. The bottom surface of the insulation material layer 101 is opposite to the top surface on which the top semiconductor layer 102 is formed. The electrode layer 108 is electrically connected with the conductive layer 110.

Further, the semiconductor structure also includes a passivation layer 109 on the bottom surface of the insulation material layer 101. The passivation layer 109 covers the side surfaces and the bottom surface of the electrode layer 108. The bottom surface refers to the surface of the electrode layer 108 opposing to the surface contacting with the bottom surface of insulation material layer 101.

The semiconductor structure utilizes the advantages of the SOI substrate; and the bottom semiconductor layer (not shown) on the bottom surface of the insulation material layer 101 is removed. Such a semiconductor structure can be used in radio frequency (RF) devices. However, the performance of the semiconductor structures needs further improvements.

When the semiconductor structure is in operation, a self-heating effect occurs inside the semiconductor structure; and heat is generated inside the semiconductor structure. Because the bottom semiconductor layer on the bottom surface of the insulation material layer 101 is removed, the heat generated by the self-heating effect is not transferred to the external environment by the bottom semiconductor layer, but is transferred to the external environment by the insulation layer 101 and air. The bottom semiconductor layer is often made of silicon, germanium, or silicon germanium. Comparing with the thermal conductivity of the bottom semiconductor layer, the thermal conductivity of air is significantly lower. Thus, after removing the bottom semiconductor layer, the self-heating effect inside the semiconductor structure is more obvious. Further, the transfer rate of the generated heat to the external environment is reduced; and the internal temperature of the semiconductor structure is increased. Thus, the electrical properties of the semiconductor structure may be degraded. For example, the saturation current of the semiconductor structure is obviously reduced.

The present disclosure provides semiconductor structures and fabrication methods thereof. An exemplary semiconductor structure may include a first opening penetrating through a first dielectric layer, an isolation structure and an insulation material layer between adjacent transistor regions. A first heat-conducting layer may be formed in the first opening. The thermal conductivity of the first heat-conducting layer may be greater than the thermal conductivity of the isolation structures. Further, the semiconductor structure may also include zeroth conductive vias penetrating through the first dielectric layer formed on doping regions; and zeroth conductive layers electrically connected with the zeroth conductive vias formed on the first dielectric layer. Further, the semiconductor structure may also include a second dielectric layer covering the zeroth conductive layers formed on the first dielectric layer; and an interconnect structure electrically connected with the zeroth conductive layers formed in the second dielectric layer. The interconnect structure may include top conductive layers exposed by the second dielectric layer. Further, the semiconductor structure may also include a carrier wafer bonded with the top surface of the second dielectric layer; and a through hole connecting with the interconnect structure and penetrating through the insulation material layer. Further, the semiconductor structure may also include a bottom layer conductive via filled in the through hole. The disclosed semiconductor structure may improve the self-heating issue; and enhance the electrical properties of the semiconductor structure. For example, the saturation current of the semiconductor structure may be increased.

Figure 2:
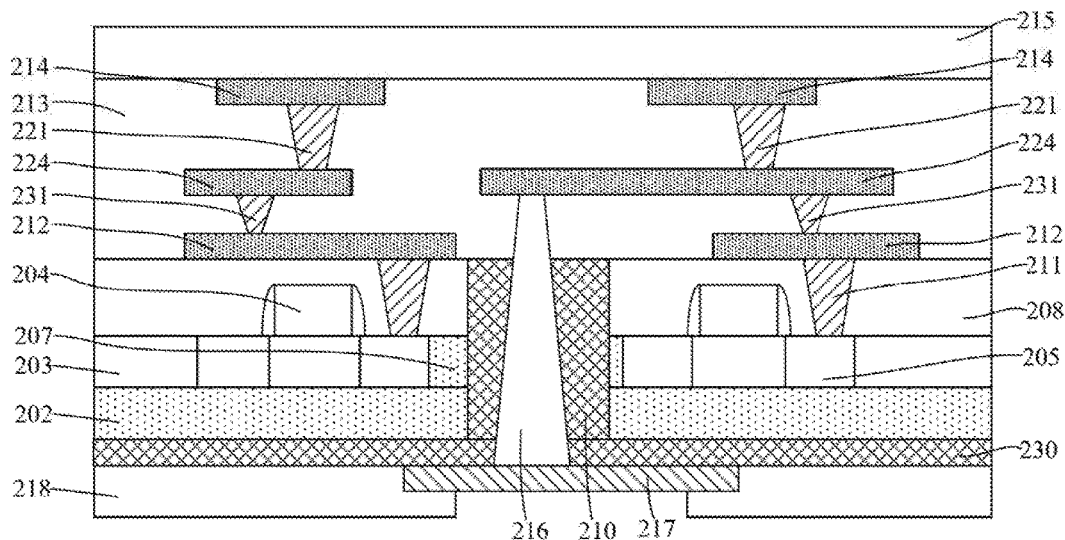
FIG. 2 illustrates a cross-sectional view of an exemplary semiconductor structure consistent with the disclosed embodiments.

FIG. 2 illustrates an exemplary semiconductor structure consistent with the disclosed embodiments. As shown in FIG. 2, the semiconductor structure may include an insulation material layer 202 having a top surface and an opposing bottom surface; and a top semiconductor layer 203 on a top surface of the insulation material layer 202. The top semiconductor layer 203 may include a plurality of transistor regions (not labeled); and isolation structures 207 may be formed in the top semiconductor layer 203 between the adjacent transistor regions. Further, gate structures 204 may be formed on portions of the surface of the top semiconductor layer 203 in the transistor regions. Further, doping regions 205 may be formed in the top semiconductor layer 203 at two sides of the gate structures 204. Further, a first dielectric layer 208 may be formed on the surfaces of the top semiconductor layer 203 and the isolation structures 207. The first dielectric layer 208 may cover the gate structures

204 and the doping regions 205; and the top of the first dielectric layer 208 may be higher than the top of the gate structure 204.

Further, the semiconductor structure may also include a first opening (not labeled) penetrating through the first dielectric layer 208, the isolation structure 207 and the insulation material layer 202 between adjacent transistor regions. A first heat-conducting layer 210 may be filled in the first opening. The thermal conductivity of the first heat-conducting layer 210 may be greater than the thermal conductivity of the isolation structures 207.

Further, the semiconductor structure may also include zeroth conductive vias 211 penetrating through the first dielectric layer 208 formed on the doping regions 205; and zeroth conductive layers 212 electrically connected with the zeroth conductive vias 211 formed on the first dielectric layer 208. A second dielectric layer 213 covering the zeroth conductive layers 212 may be formed on the first dielectric layer 208.

Further, the semiconductor structure may also include an interconnect structure (not labeled), formed in the second dielectric layer 213. The interconnect structure may electrically connect with the zeroth conductive layers 212; and may include a top electrode layer 214 exposed by the second dielectric layer 213.

Further, the semiconductor structure may also include a carrier wafer 215 bonded with the surface of the second dielectric layer 213 and the surface of the top conductive layer 214; and a through hole (not labeled) penetrating through tire insulation material layer 202 and electrically connected with the interconnect structure. A bottom layer conductive vias 216 may be formed in the through hole.

Further, the semiconductor structure may also include a second heat-conducting layer 230 formed on the bottom surface of the insulation material layer 202. The second heat-conducting layer 230 may also contact with the first heat-conducting layer 210.

Further, the semiconductor structure may also include a backside pad layer 217 formed on a portion of the surface of the second heat-conducting layer 230. The backside pad layer 217 may contact with the bottom layer conductive via 216, and may be electrically connected with the bottom layer conductive via 216.

Further, the semiconductor structure may also include a passivation layer 218 formed on the second heat-conducting layer 230. The passivation layer 218 may cover the backside pad layer 217. The passivation layer 218 may be used to protect the backside pad layer 217. Specifically, the passivation layer 218 may reduce of the area of the backside pad layer 217 contacting with the external environment; and prevent the external environment from damaging the backside pad layer 217. For example, the corrosion caused by the external environment may be reduced.

The insulation material layer 202 may be made of any appropriate material, such as silicon oxide, silicon nitride, silicon oxynitride, or silicon oxycarbonitride, etc. In one embodiment, the insulation material layer 202 is made of silicon oxide.

The top semiconductor layer 203 may be made of any appropriate material, such as silicon, germanium, silicon germanium, silicon carbide, gallium arsenide, or gallium indium, etc. In one embodiment, the top semiconductor layer 203 is made of silicon.

Transistors are formed in the transistor regions. In one embodiment, the isolation structures 207 are formed between adjacent transistor regions; and are used to electrically isolate adjacent transistor regions. In one embodiment, the isolation structures 207 penetrate through the top semiconductor layer 203, i.e., penetrating through the entire thickness of the top semiconductor layer 203. In certain embodiments, the isolation structures 207 may penetrate through a partial thickness of the top semiconductor layer 203. That is, the thickness of the isolation structures 207 may be smaller than the thickness of the top semiconductor layer 203; and the top of the isolation structures 207 may level with the top of the top semiconductor layer 203.

The isolation structures 207 may be made of any appropriate material such as silicon oxide, silicon nitride, silicon oxynitride, or silicon oxycarbonitride, etc. In one embodiment, the isolation structures 207 are shallow trench isolation (STI) structures; and made of silicon oxide.

The gate structures 204 may include a gate dielectric layer (not labeled) and a gate electrode layer (not labeled) formed on the gate dielectric layer. The gate dielectric layer may be made of any appropriate material, such as silicon oxide, or high dielectric constant (high-K) dielectric material, etc. The high-K dielectric material may include HiO, ZrO, AlO, or HfSiO, etc. The gate electrode layer may be made of any appropriate material, such as one or more of Ti, Ta, Cu, Al, W, Ag, and Au, etc. A work function layer may be formed between the gate dielectric layer and the gate electrode layer. Further, in one embodiment, sidewall spacers (not shown) may be formed on the side surfaces of the gate structures 204.

The doping regions 205 may be used to form the sources and the drains of the transistors. When the corresponding transistor regions are PMOS regions, the doping ions in the doping regions 205 may be P-type ions, such as B ions, Ge ions, or In ions, etc. When the corresponding transistor regions are NMOS regions, the doping ions in the doping regions 205 may be N-type ions, such as P ions, As ions, and/or Sb ions.

The first dielectric layer 208 may cover the top and the side surfaces of the gate structures 204. The first dielectric layer 208 may be a single layer structure or a multiple-layer stacked structure. The first dielectric layer 208 may be made of any appropriate material, such as one or more silicon oxide, silico nitride, or silicon oxynitride, etc. In one embodiment, the first dielectric layer 208 is made of silicon oxide.

The first opening may penetrate through the first dielectric layer 208, the isolation structure 207 and the insulation material layer 202 between adjacent transistor regions. Along a direction parallel to the surface of the top semiconductor layer 203, the width of the first opening may be smaller than the distance between the adjacent transistor regions. Such a size configuration may cause the first opening and the adjacent transistors to be separated by portions of the isolation structures 207.

Because the portions of the isolation structures 207 may be disposed between the first opening and the adjacent transistor regions, to ensure the portions of the isolation structures 207 to have an enough isolation property, the width of the portions of the isolation structures 207 between the first opening and the adjacent transistor regions may not be substantially small. If the width of the portions of the isolation structures 207 between the first opening and the adjacent transistor regions is substantially small the doping region 205 at one side of the gate structure 207 and the first heat-conducting layer 210 at the other side of the gate structure 207 may be easy to have an electrical connection. That is, the doping regions 205 in different transistor regions 205 may have undesired electrical connections.

At the same time, the first heat-conducting layer 210 may be filled in the first opening, and the thermal conductivity of the first heat-conducting layer 210 may be greater than the thermal conductivity of the isolation structures 207. If the width of the portions of the isolation structures 207 between the first opening and the adjacent transistor regions is significantly large, the width of the corresponding first opening may be relatively small. Thus, the volume of the first heat-conducting layer 210 may be relatively small. Accordingly, the heat transfer ability of the heat-conducting layer 210 may not be as desired.

Thus, in one embodiment, along a direction parallel to the surface of the top semiconductor layer 203, the width of the portions of the isolation structures 207 between the first opening and the adjacent transistor regions may be in a range of approximately 0.1 µm-0.4 µm. Such a size range may meet the design requirements.

The thermal conductivity of the first heat-conducting layer 210 may be greater than the thermal conductivity of the isolation structures 207. When the semiconductor structure is in operation, heat may be generated inside the transistors. The heat may include Joule heat, etc. Especially for NMOS transistors, the generated heat may be relatively large. In one embodiment, the first heat-conducting layer 210 may be formed between adjacent transistor regions; and the adjacent transistor regions may be isolated by the isolation structures 207 and the first heat-conducting layer 210. The heat generated inside the transistors may be transferred to the first heat-conducting layer 210. Because the thermal conductivity of the first heat-conducting layer 210 may be greater than the thermal conductivity of the isolation structures 207, comparing with the semiconductor structure having the transistors only isolated by the isolation structures, the heat generated by the transistors in the disclosed semiconductor structure may be transferred to outside through the isolation structures 207 and the first heat-conducting layer 210 with a faster speed. Thus, the overheating inside the semiconductor structure may be prevented; and the semiconductor structure may have desired electrical properties.

The first heat-conducting layer 210 may be made of any appropriate material, such as polysilicon, or amorphous silicon, etc. As analyzed previously, in one embodiment, along a direction parallel to the surface of the top semiconductor layer 203, the width of the portions of the isolation structures 207 between the first heat-conducting layer 210 and the adjacent transistor regions may be in a range of approximately 0.1 µm-0.4 µm.

The zeroth conductive vias 211 may electrically connect the doping regions 205 with the zeroth conductive layers 212. The top of the zeroth conductive vias 211 may level with the top of the first dielectric layer 208. In one embodiment, the zeroth conductive vias 211 may be on portions of the surfaces of the doping regions 205. In certain other embodiments, the zeroth conductive vias 211 may be on the entire surfaces of the doping regions 205. The zeroth conductive vias 211 may be made of any appropriate material, such as one or more of Cu, Al, W, and Ti, etc.

In one embodiment, the zeroth conductive layers 212 are formed on the surface of the first dielectric layer 208 and the surfaces of the zeroth conductive vias 211. In certain embodiments, a plurality of discrete zero conductive layers 212 may be formed on the surface of the first dielectric layer 208 according to the internal interconnect requirements of the semiconductor structure. The zero conductive layers 212 may be made of any appropriate material, such as one or more of Cu, Al, W, and Ti, etc. In one embodiment, the zeroth conductive layers 212 are made of Cu.

Along a direction perpendicular to the surface top semiconductor layer 203 and from the insulation material layer 202 to the second dielectric layer 213, the interconnect structure may include N (N≥2) layers of the conductive layers; and a plurality of $N^{th}$ conductive vias between the $(N-1)^{th}$ conductive layer and the Nth conductive layer. The Nth conductive vias may electrically connect the $(N-1)^{th}$ conductive layers with the $N^{th}$ conductive layers. The $N^{th}$ conductive layers may be the top conductive layers 214 exposed by the second dielectric layer 213.

In one embodiment, as shown in FIG. 2, the interconnect structure may include two discrete layers of conductive layers. Along the direction from the insulation material layer 202 to the second dielectric layer 213, the interconnect structure may include the first conductive layers 224, the second conductive layers 214, and the second conductive vias 221 between the first conductive layers 224 and the second conductive layers 214. The second conductive vias 221 may electrically connect the first conductive layers 224 with the second conductive layers 214. Further, the interconnect structure may also include the first conductive vias 231 on the first conductive layers 224. The first connective vias 231 may electrically connect with the zeroth conductive layers 212. The second conductive layers 214 may be also be referred to as the top conductive layers 214.

In certain embodiments, the interconnect structure may only include one conductive layer. The interconnect structure may include a top conductive layer; and first conductive vias electrically connecting the top electrode layer with the first conductive vias.

The number of the conductive layers may be any appropriate natural number greater than 2, such as five, seven, or ten, etc. The number of the conductive vias may be determined according to the number of the conductive layers.

The second dielectric layer 213 may include at least one sub-dielectric layer. The second dielectric layer 213 may be stacked by at least one sub-dielectric layer. The sub-dielectric layer may be made of any appropriate material, such as silicon oxide, silicon nitride, silicon oxynitride, silicon carbonitride; or silicon carbonoxynitride, etc. The second dielectric layer 213 may be a single layer structure, or a two-layer structure, a five-layer structure, a seven-layer structure, or a ten-layer structure, etc.

The carrier wafer 215 may be made of any appropriate material, such as silicon, germanium, silicon germanium, silicon carbide, gallium arsenide, or gallium indium, etc. The carrier wafer 215 may also be a glass wafer, or a PCB board, etc. In one embodiment, the carrier wafer 215 is a silicon wafer.

An adhesion layer (not shown) may be formed between the carrier wafer and the second dielectric layer 213. The adhesion layer may be a single layer structure, or a multiple-layer stacked structure. The adhesion layer may be made of polysilicon, or amorphous silicon, etc.

In one embodiment, to further increase the heat transfer rate from the inside of the semiconductor structure to the external environment; and further reduce the temperature inside the semiconductor structure, the second heat-conducting layer 230 may be formed on the bottom surface of the of the insulation material layer 102. As used herein, the bottom surface of the insulation material layer 202 may refer to the surface of the insulation material layer 202 opposing to the surface of the insulation material layer 202 having the top semiconductor layer 203.

The thermal conductivity of the second heat-conducting layer 230 may be greater than the thermal conductivity of air. Comparing with directly transferring the heat in the first heat-conducting layer 210 to air, the heat transfer rate of the heat in the first heat-conducting layer 210 through the second heat-conducting layer 230 may be faster. Thus, the heat inside the semiconductor structure may be timely transferred to the external environment. Accordingly, the temperature inside the semiconductor structure may be further reduced; and the electrical properties of the semiconductor structure may be improved. That the thermal conductivity of the second heat-conducting layer 230 may be greater than the thermal conductivity of air may refer to that under the same external conditions, such as same temperature and pressure, etc., the thermal conductivity of the second heat-conducting layer 230 is greater than the thermal conductivity of air.

The second heat-conducting layer 230 may be made of any appropriate material, such as polysilicon, or amorphous silicon, etc. If the second heat-conducting layer 230 is substantially thin, the heat transferred in per unit time may be substantially less. If the second heat-conducting layer 230 is significantly thick, it may not match the device miniaturization trend. Thus, in one embodiment, the thickness of the second heat-conducting layer 230 may be in a range of approximately 500 Å-2000 Å.

Referring to FIG. 2, the through hole (not labeled), i.e., used for forming the bottom layer conductive via 216, may also penetrate through the second heat-conducting layer 230. The through hole may expose the surface of one of the N layer of conductive layers. In one embodiment, the through hole may expose one of the first conductive layers 224. In certain embodiments, the through hole may expose the surface of one of the top conductive layers 214.

The bottom layer conductive via 216 may be made of any appropriate conductive material, such as one or more of Cu, Al, W, and Ti, etc. In one embodiment, the top of the bottom layer conductive via 216 may level with the top surface of the second conductive layer 230.

Further, in one embodiment, the through hole may also penetrate through the first heat-conducting layer 210. Thus, the corresponding bottom layer conductive via 210 may also penetrate through the first heat-conducting layer 210. The thermal conductivity of the bottom layer conductive via 216 may be greater than the thermal conductivity of the first heat-conducting layer 210. Thus, it may be equivalent that a portion of the first heat-conducting layer 210 is substituted by the bottom layer conductive via 216 that has a higher thermal conductivity. Therefore, the heat transfer rate of the heat generated inside the semiconductor structure to the external environment may be further increased; and the temperature inside the semiconductor structure may be further reduced.

To prevent the bottom layer conductive via 206 penetrating through the first conductive layer 210 from adversely affecting the insulation properties between adjacent doping regions 205, in one embodiment, along a direction parallel to the surface of the top semiconductor layer 203, the width of the portions of the first heat-conducting layer 210 at the two sides of the bottom layer conductive via 216 may be greater than approximately 0.1 μm.

In certain embodiments, the through hole and the first heat-conducting layer may be staggered. That is, the through hole and the first heat-conducting layer may have no contact interface.

Referring to FIG. 2, the backside pad layer 217 may be formed on the surface of the bottom layer conductive via 216. Because the second heat-conducting layer 230 may be formed on the surface of the insulation material layer 202, the backside pad layer 217 may be on a portion of the surface of the second heat-conducting layer 230. The backside pad layer 217 may be used to connect the interconnect structure with external circuits and other devices, etc. The backside pad layer 217 may be made of any appropriate material, such as one or more of Cu, Al, W, and Ti, etc.

In one embodiment, the second heat-conducting layer 230 is formed on the back surface of the insulation material layer 202. Thus, the backside pad layer 217 may be on the surface of the bottom layer conductive via 216; and may also be on the portion of the second heat-conducting layer 230. In certain embodiments, when the second heat-conducting layer is not formed on the bottom surface of the insulation material layer 202, the backside pad layer 217 may be on the bottom layer conductive via 216; and may also be on the portion of the bottom surface of the insulation material layer 202.

Further, referring to FIG. 2, the passivation layer 218 may be formed on portions of the surface of the backside pad layer 217 and portions of the surface of the second heat-conducting layer 230. The passivation layer 218 may be used to protect the backside pad layer 217. The passivation layer 218 may be made of any appropriate insulation material, such as silicon oxide, silicon nitride, silicon oxynitride, or epoxy, etc.

Thus, according to the disclosed semiconductor structure, because a portion of the insulation structure may be occupied by a first heat-conducting layer; and the thermal conductivity of the first heat-conducting material may be greater than the thermal conductivity of the insulation material, the heat inside the semiconductor structure may be transferred through the isolation structure and the first heat-conducting layer. Comparing with the heat transfer through the isolation structure only, the heat transfer rate may be increased; and the heat may be transferred to the external environment more rapidly. Thus, the temperature inside the semiconductor structure may be reduced; and the self-heating issue may be improved.

Figure 12:
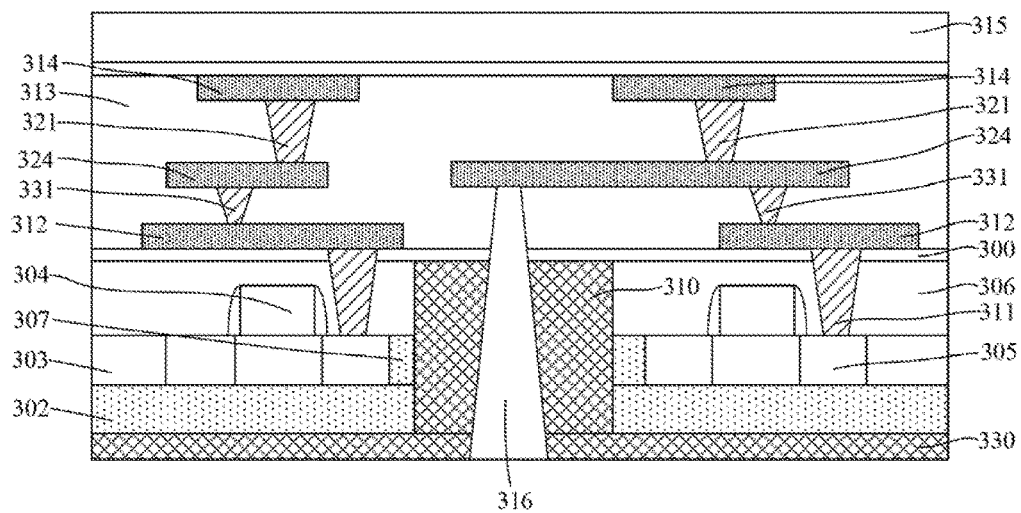
Figure 13:
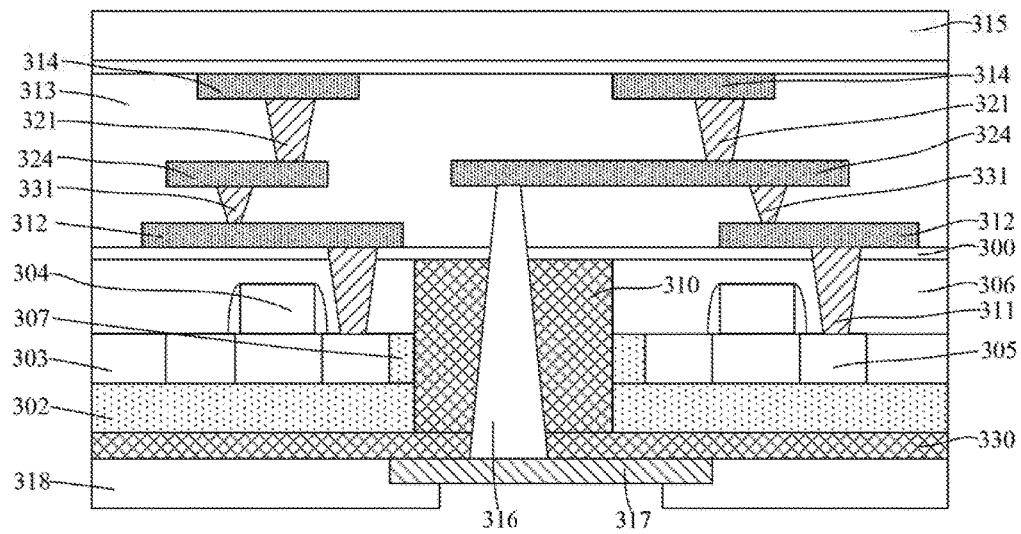
Figure 14:
FIG. 14 illustrates an exemplary fabrication process of a semiconductor structure consistent with the disclosed embodiments.

FIG. 14 illustrates an exemplary fabrication process of a semiconductor structure consistent with the disclosed embodiments. FIGS. 3-13 illustrate structures corresponding to certain stages of the exemplary fabrication process.

Figure 3:
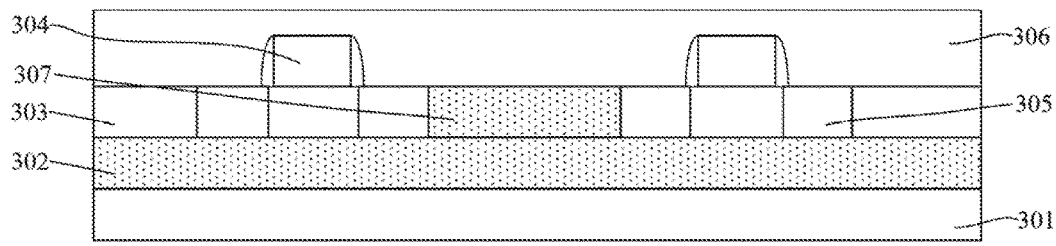
FIGS. 3-13 illustrate semiconductor structures corresponding to certain stages of an exemplary fabrication process of a semiconductor structure consistent with the disclosed embodiments.

As shown in FIG. 14, at the beginning of fabrication process, a bottom semiconductor layer with certain structures is provided (S101). FIG. 3 illustrates a corresponding semiconductor structure.

As shown in FIG. 3, a bottom semiconductor layer 301 is provided. An insulation material layer 302 may be formed on the surface of bottom semiconductor layer 301; and a top semiconductor layer 303 may be formed on the surface of the insulation material layer 302.

The top semiconductor layer 302 may have a plurality of transistor regions (not labeled). Gate structures 304 may be formed on portions of the top semiconductor layer 303 in the transistor regions. Further, doping regions 305 may be formed in the top semiconductor layer 303 at two sides of the gate structures 304.

In one embodiment, the bottom semiconductor layer 301, the insulation material layer 302 and the top semiconductor layer 303 may be from a SOI wafer. In some embodiments, the insulation material layer 302 and the top semiconductor layer 303 may be sequentially deposited on the bottom semiconductor layer 301.

The bottom semiconductor layer 301 may be made of silicon, germanium, silicon germanium, silicon carbide, gallium arsenide, or gallium indium, etc. The insulation material layer 302 may be made of silicon oxide, silicon nitride, silicon carbide, silicon oxynitride, silicon carbonitride, or silicon carbonoxynitride, etc. The top semiconductor layer 301 may be made of silicon, germanium, silicon germanium, gallium arsenide, or gallium indium, etc. In one embodiment, the bottom semiconductor layer 301 is made of silicon; the insulation material layer 302 is made of silicon oxide; and the top semiconductor layer 303 is made of silicon.

The transistor regions may provide a process platform for forming transistors. In one embodiment, to electrically isolate the adjacent transistor regions, isolation structures 307 may be formed in the top semiconductor layer 303 between the adjacent transistor regions. The isolation structures 307 may penetrate through the entire thickness of the top semiconductor layer 303.

In one embodiment, the isolation structures 307 are adjacent to the transistor regions; and two transistor regions are illustrated. In some embodiments, the number of the transistor regions may be other appropriate value; and may not be limited.

The gate structures 304 may be formed on portions of the surfaces of the transistor regions. Doping regions 305 may be formed in the top semiconductor layer 303 at the two sides of the gate structures 304. The detailed information of the gate structures 304 and the doping regions 305 may refer to the gate structures 204 and the doping regions 205 described previously.

Further, a first dielectric layer 306 may be formed on the surface of the top semiconductor layer 303. The first dielectric layer 306 may cover the gate structures 304, and the doping regions 305. The top of the first dielectric layer 306 is higher than the tops of the gate structures 304. Various processes may be used to form the first dielectric layer 306, such as a chemical vapor deposition (CVD) process, a physical vapor deposition (PVD) process, or an atomic layer deposition (ALD) process, etc.

Figure 4:
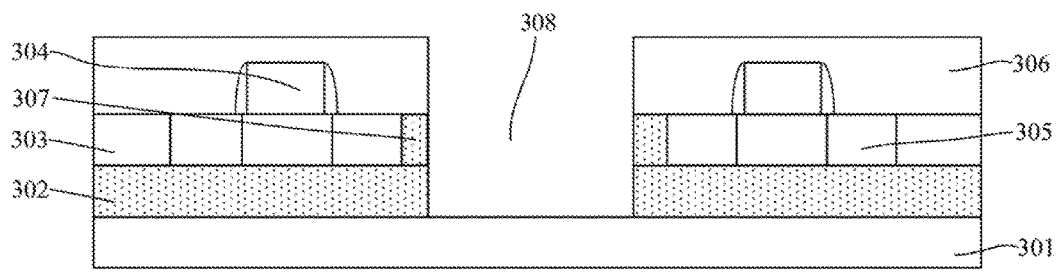

Returning to FIG. 14, after forming the first dielectric layer 306, a first opening may be formed (S102). FIG. 4 illustrates a corresponding structure.

As shown in FIG. 4, a first opening 308 is formed in the first dielectric layer 306, the isolation structure 307 and the insulation material layer 302. That is, the first opening 308 may penetrate through the first dielectric layer 306, the isolation structure 307, the top semiconductor layer 302, and the insulation material layer 303.

The process for forming the first opening 308 may include forming a first patterned layer exposing the portion of the surface of the first dielectric layer 306 between adjacent transistor regions on the surface of the first dielectric layer 206; etching the portion of the first dielectric layer 306 between the adjacent transistor regions, the portion of the top semiconductor layer 303 between adjacent transistor regions and the portion of the insulation material layer 302 between adjacent transistor region using the first patterned layer as an etching mask; and removing the first patterned layer. The etching process may be a dry etching process; and the dry etching process may be performed until the surface of the bottom semiconductor layer 301 is exposed. Thus, the first opening 308 may be formed. The width of the portion of the isolation structures 307 between the first opening 307 and the adjacent transistor regions may be in a range of approximately 0.1 μm-0.4 μm.

Figure 5:
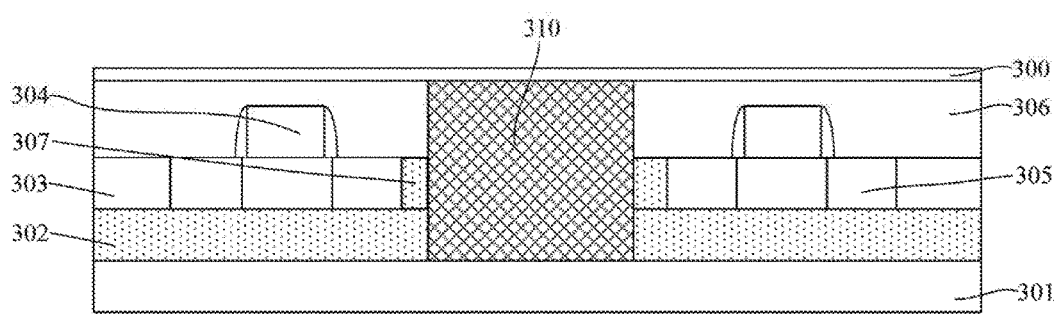

Returning to FIG. 14, after forming the first opening 308, a first heat-conducting layer may be formed (S103). FIG. 5 illustrates a corresponding semiconductor structure.

As shown in FIG. 5, a first heat-conducting layer 310 is formed in the first opening 308. The thermal conductivity of the first heat-conducting layer 310 may be greater than the thermal conductivity of the isolation structures 307.

The first heat-conducting layer 310 may fee made of amorphous silicon or polysilicon, etc. Various processes may be used to form the first heat-conducting layer 310, such as a CVD process, a PVD process, or an ALD process, etc.

The process for forming the first heat-conducting layer 310 may include forming a heat-conducting film in the first opening 308 and on the surface of the first dielectric layer 306; and removing the portion of the heat-conducting film above the surface of the first dielectric layer 306. Thus, the first heat-conducting layer 310 may be formed. The portion of the heat-conducting conducting film above the surface of the first dielectric layer 306 may be removed by a chemical mechanical polishing (CMP) process, etc.

To prevent the CMP process from damaging the surface of the first dielectric layer 306, before forming the heat-conducting film, a first stop layer (not shown) may be formed on the side surfaces and the bottom surface of the first opening 308 and the surface of the first dielectric layer 306. The first stop layer may be made of a material different from the first dielectric layer 306 and the first heat-conducting layer 310. Thus, during the CMP process for removing the portion of the heat-conducting film above the surface of the first dielectric layer 306, the first stop layer may function as a polishing stop layer to prevent the surface of the first dielectric layer 306 from being exposed in the polishing environment.

Further, as shown in FIG. 5, after forming the first heat-conducting layer 310, a second stop layer 300 may be formed on the first heat-conducting layer 310 and the first dielectric layer 306. The second stop layer 310 may be made of a material different from that of the first heat-conducting layer 310 to prevent the subsequent processes for forming zeroth conductive vias and zeroth conductive layers from damaging the first heat-conducting layer 310.

In one embodiment, the second stop layer 300 may be made of silicon nitride. The thickness of the second stop layer 300 may be in a range of approximately 5 Å-20 Å. In some embodiments, the second stop layer may be optional; and may be omitted.

Figure 6:
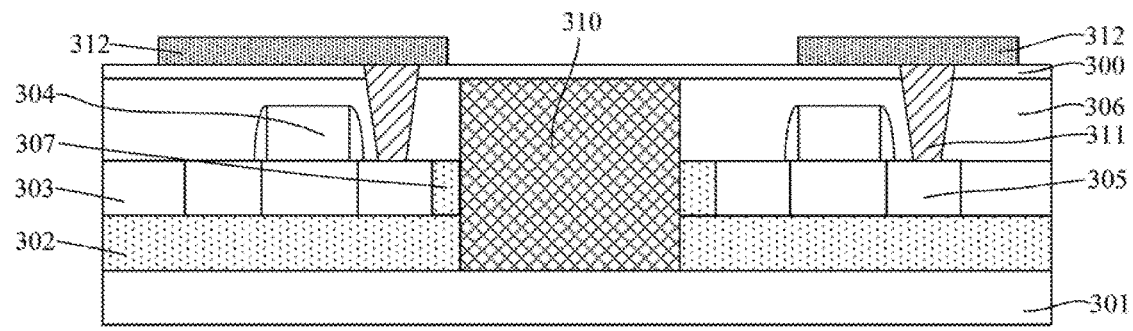

Returning to FIG. 14, after forming the second stop layer 300, zeroth conductive vias and zeroth conductive layers may be formed (S104). FIG. 6 illustrates a corresponding semiconductor structure.

As shown in FIG. 6, zeroth conductive vias 311 penetrating through the first dielectric layer 306 are formed in the first dielectric layer 306. The zeroth conductive vias 311 may be electrically connected with the first doping regions 305. Further, zeroth first conductive layers 312 may be formed on portions of the surface of the first dielectric layer 306. The zeroth conductive layers 312 may be electrically connected with the zeroth conductive vias 311.

In one embodiment, the zeroth conductive vias 311 are formed on the surfaces of the first doping regions 305; and the zeroth conductive layers 312 are formed on the surfaces of the zeroth conductive vias 311. Because the second stop layer 300 may be formed on the surface of the first dielectric layer 306, the zeroth conductive vias 311 may also penetrate through the second stop layer 300; and the zeroth conductive layers 312 may be formed on the surface of the second stop layer 300.

In one embodiment, the process for forming the first conductive vias 311 may include forming a second patterned layer exposing portions of the surface of the second stop layer 300; forming second contact through holes by etching the second stop layer 300 and the first dielectric layer 306 until the surfaces of the doping regions 305 are exposed using the second patterned layer as an etching mask; removing the second patterned layer; and forming the zero conductive vias 311 by filling the second contact through holes.

In one embodiment, the process for forming the zeroth conductive layers 312 may include forming a zeroth conductive film on the surface of the second stop layer 300 and the top surfaces of the zeroth conductive vias 311; and patterning the zeroth conductive film. Thus, the plurality of discrete zeroth conductive layers 312 may be formed on the surface of the second stop layer 300. The zeroth conductive layers 312 may be electrically connected with the zeroth conductive vias 311.

In some embodiments, the zeroth conductive vias and the zeroth conductive layers may be formed by the Damascene process. Specifically, before forming the zeroth conductive vias and the zeroth conductive layers, a sub-dielectric layer may be formed on the surface of the first dielectric layer. Then, the sub-dielectric layer and the first dielectric layer may be etched to form first through holes and the first trenches contacting through the first through holes on the first through holes. Then, forming the first zeroth conductive vias in the first through holes and the zeroth conductive layers in the first trenches.

In one embodiment, the first heating-conducting layer 310 may be formed firstly; followed by forming the zeroth conductive vias 311 and the zeroth conductive layers 312. In some embodiments, the zeroth conductive vias and the zeroth conductive layers may be formed first; followed by forming the first heat-conducting layers.

Figure 7:
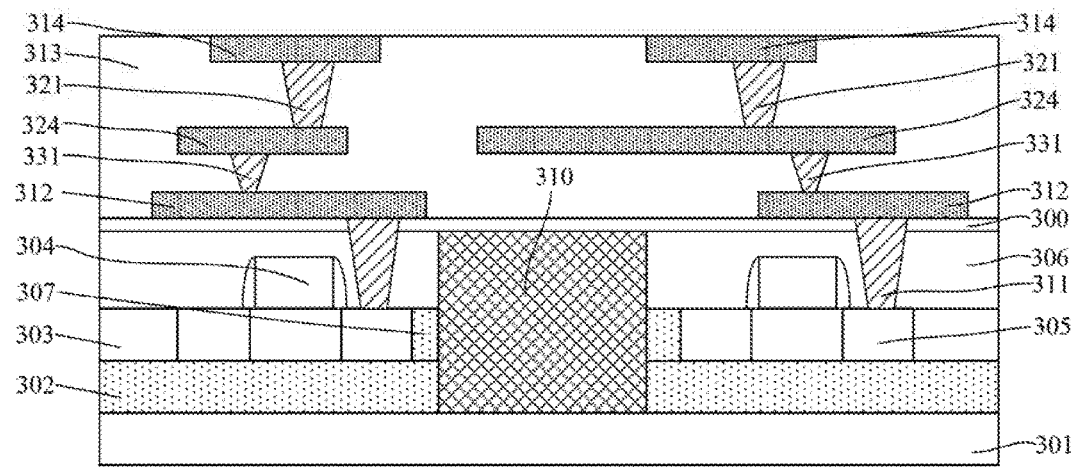
Figure 8:
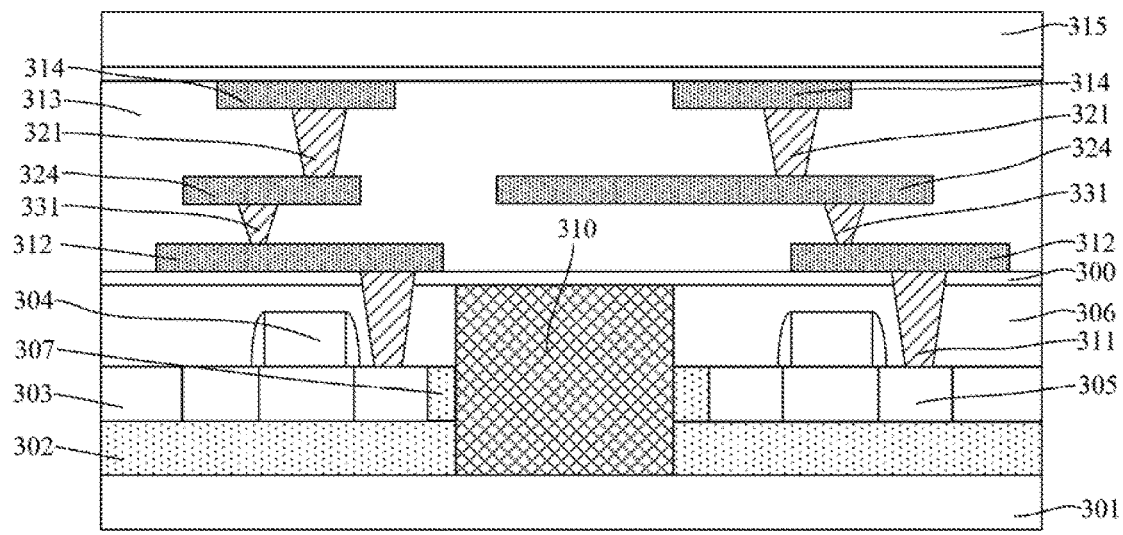

Returning to FIG. 14, after forming the zeroth conductive layers 312, a second dielectric layer and an interconnect structure may be formed (S105). FIG. 7 illustrates a corresponding semiconductor structure.

As shown in FIG. 7, a second dielectric layer 313 is formed over the first dielectric layer 316. The second dielectric layer 313 may cover the zeroth conductive layers 312.

Further, an interconnect structure (not labeled) may be formed in the second dielectric layer 313. The interconnect structure may be electrically connected with the zeroth conductive layers 312. The interconnect structure may include the top conductive layers 314 exposed by the second dielectric layer 313, first conductive layers 324, first conductive vias 331 and second conductive vias 321, etc.

The second dielectric layer 313 may be made of any appropriate material, such as one or more of silicon oxide, silicon nitride, silicon oxynitride, silicon carbonitride, or silicon oxycarbonitride, etc. The second dielectric layer 313 may be a stacked structure including at least one sub-dielectric layer.

Along a direction perpendicular to the surface of the semiconductor layer 303 and directing from the insulation material layer 302 to the second dielectric layer 313, the interconnect structure may include N (N≥2) layers of conductive layers; and a plurality of $N^{th}$ conductive vias between the $(N-1)^{th}$ conductive layer and the Nth conductive layer. The $N^{th}$ conductive vias may electrically connect the $(N-1)^{th}$ conductive layers with the Nth conductive layers. The $N^{th}$ conductive layers may be the top conductive layers 314 exposed by the second dielectric layer 313.

In one embodiment, the interconnect structure may include two layers of conductive layers. Along the direction directing from the insulation material layer 302 to the second dielectric layer 313, the interconnect structure may include the first conductive layers 324 and the second conductive layers 314. Further, the interconnect structure may also include the second conductive vias 321 formed between the first conductive layers 324 and the second conductive layers 314. The second conductive vias 321 may electrically connect the first conductive layers 324 with the second conductive layers 314. Further, the interconnect structure may also include first conductive vias 331 between the first conductive layers 324 and the zeroth conductive layers 312. The first connective vias 331 may electrically connect the first conductive layers 324 with the zeroth conductive layers 312. The second conductive layers 314 may be referred to as the top conductive layers 314.

In some embodiments, the interconnect structure may include one layer of conductive layers. The interconnect structure may include the top conductive layers and first conductive vias electrically connecting the top conductive layers with the zero conductive layers.

The process for forming the second dielectric layer 313 and the interconnect structure may refer to the previous description for forming the first dielectric layer 306, the zeroth conductive vias 311 and the zeroth conductive layers 312.

Figure 9:
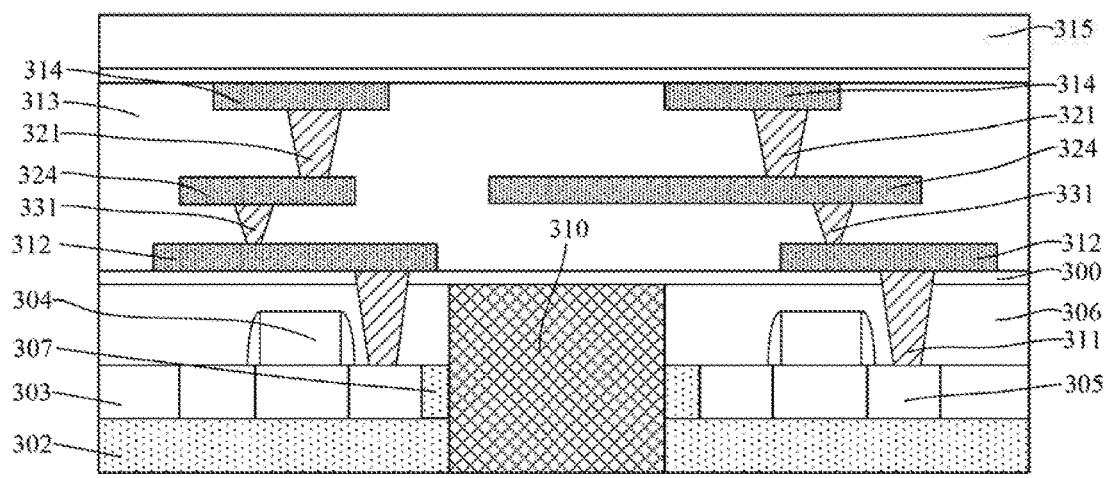

Returning to FIG. 13, after forming the second dielectric layer 313 and the interconnect structure, a carrier wafer may be provided; and the carrier wafer may be bonded with the second dielectric layer 313 (S106). FIG. 9 illustrates a corresponding structure.

As shown in FIG. 9, a carrier wafer 315 is provided; and the carrier wafer 315 may be boned with the top surface of the second dielectric layer 313. The carrier wafer 315 may be a silicon wafer.

The carrier wafer 315 may be bonded with the second dielectric layer 313 by any appropriate process. In one embodiment, a hot-press bonding process may be used to bond carrier wafer 315 with the second dielectric layer 313.

To increase the bonding stress, before the hot-press bonding process, an adhesion layer may be formed on the surface of the carrier wafer 315, the surfaces of the top conductive layers 314 and the surface of the second dielectric layer 313. The adhesion layer may be made of polysilicon, or amorphous silicon, etc.

Returning to FIG. 14, after bonding the carrier wafer 315 with the second dielectric layer 313, the bottom semiconductor layer 301 may be removed (S107). FIG. 9 illustrates a correspond structure.

As shown in FIG. 9, the bottom semiconductor layer 301 is removed. In one embodiment, to prevent the process for removing the bottom semiconductor layer 301 from adversely affecting the insulation material layer 302 and the first heat-conducting layer 310, the process for removing the bottom semiconductor layer 301 may include removing a partial of the bottom semiconductor layer 310 by a first removing process; followed by removing the remaining bottom semiconductor layer 301 by a second removing process.

The removing rate of the first removing process may be greater than the removing rate of the second removing process. In one embodiment, the first removing process may be a polishing process; and the second removing process may be a wet etching process.

Figure 10:
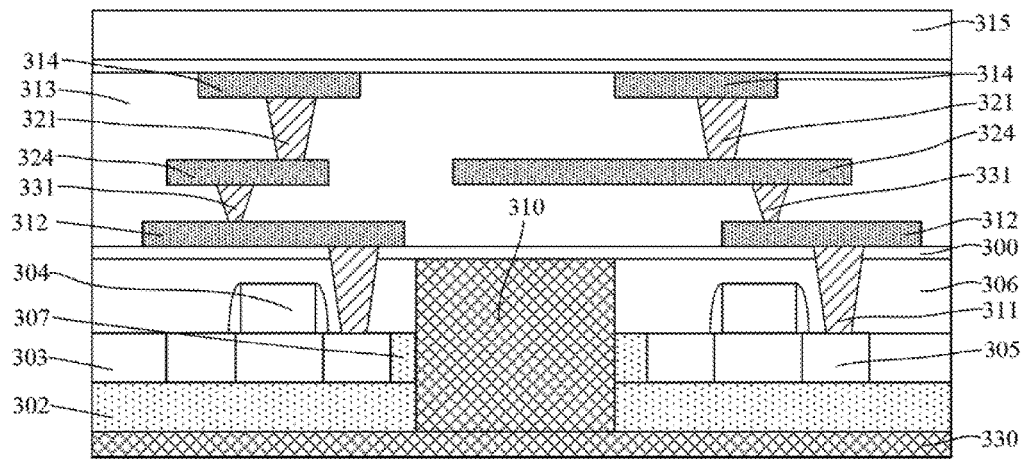

Returning to FIG. 14, after removing the first semiconductor layer 301, a second heat-conducting layer may be formed (S108). FIG. 10 illustrates a corresponding structure.

As shown in FIG. 10, a second heat-conducting layer 330 is formed on the bottom surface of the insulation material layer 302. The second heat-conducting layer 330 may also be formed on the bottom surface of the first heat-conducting layer 310. The thermal conductivity of the second heat-conducting layer 330 may be greater than the thermal conductivity of air.

In one embodiment, the second heat-conducting layer 330 may be made of polysilicon or amorphous silicon. The thickness of the second heat-conducting layer 330 may be in a range of approximately 500 Å-2000 Å.

Figure 11:
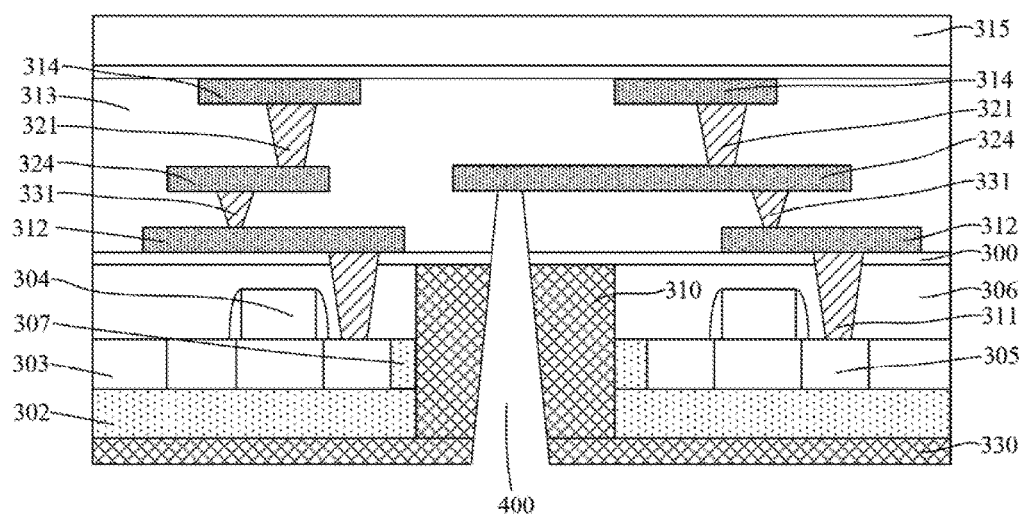

Returning to FIG. 14, after forming the second heat-conducting layer 330, a through hole may be formed (S109). FIG. 11 illustrates a corresponding structure.

As shown in FIG. 11, a through hole 400 is formed. The through hole 400 may connect with the Interconnect structure. In one embodiment, the through hole 400 may expose one of the N layers of conductive layers of the interconnect structure. In one embodiment, for illustrative purposes, the through hole 400 may expose the first conductive layer 324. The through hole 400 may be formed by performing an etching process from the bottom surface of the insulation material layer 302 to the top surface of the insulation material layer 302.

Because the second heat-conducting layer 330 may be formed on the bottom surface of the insulation material layer 302, the through hole 400 may penetrate through the second heat-conducting layer 330. Thus, the through hole 400 may penetrate through the second heat-conducting layer 400, the first heat-conducting layer 310 and a partial thickness of the second dielectric layer 313.

A bottom layer conductive via may be subsequently formed in the through hole 400. Thus, the bottom layer conductive via may be electrically connected with the interconnect structure. Therefore, the semiconductor structure may be electrically connected with external circuits and the other devices. The bottom layer conductive via may be made of a conductive material. The thermal conductivity of the bottom layer conductive via may be greater than the thermal conductivity of the first heat-conducting layer 310.

Referring to FIG. 11, the through hole 400 may penetrate through the first heat-conducting layer 310. Thus, a partial width of the first heat-conducting layer 310 may be removed. The removed portion of the first heat-conducting 310 may be substituted by the bottom layer conductive via. In one embodiment, along a direction parallel to the surface of the top semiconductor layer 303, the width of the portion of the first heat-conducting layer 310 may be equal to or greater than approximately 0.1 µm.

In some embodiments, the through hole and the first heat-conducting layer may be staggered. That is, the through hole and the first heat-conducting layer may not contact with each other.

Returning to FIG. 14, after forming the through hole 400, a bottom layer conductive via may be formed (S110). FIG. 12 illustrates a corresponding structure.

As shown in FIG. 12, a bottom layer conductive via 316 is formed in the through hole 400. In one embodiment, a surface of the bottom layer conductive via 316 may level with a surface of the second heat-conducting layer 330.

The bottom layer conductive via 316 may be made of any appropriate conductive material, such as one or more of Cu, Al, W, and Ti, etc. The thermal conductivity of the bottom layer conductive via 316 may be greater than the thermal conductivity of the first heat-conducting layer 310; and the bottom layer conductive via 316 may penetrate through the first heat-conducting layer 310. Thus the self-heating issue of the semiconductor structure may be further improved; and the electrical properties of the semiconductor structure may be further optimized.

Returning to FIG. 14, after forming the bottom layer conductive via 316, a backside pad layer may be formed (S111). FIG. 13 illustrates a corresponding structure.

As shown in FIG. 13, a backside pad layer 317 is formed on the surface of the bottom layer conductive via 316. The backside pad layer 317 may also cover portions of the surface of the second heat-conducting layer 330. The backside pad layer 317 may be used to connect the interconnect structure with external circuits and other devices.

The backside pad layer 317 may be made of any appropriate conductive material, such as one or more of Cu, Al, W, and Ti, etc. In one embodiment, the process for forming the backside pad layer 317 may include forming a backside pad film on the surface of the second heat-conducting layer 330 and the surface of the bottom layer conductive via 316; and patterning the backside pad film to form the backside pad layer 317 on the surface of the bottom layer conductive via 316.

In some embodiments, the method for forming the backside pad layer 317 may include forming a conductive film to fill the through hole and on the surface of the second heat-conducting layer 330; planarizing the conductive film; and patterning the conductive film to remove portions of the conductive film on the surface of the second heat-conducting layer 330 to form the bottom layer conductive via filling the through hole, and the backside pad layer on the surface of the bottom layer conductive via 316.

Further, as shown in FIG. 13, after forming the backside pad layer 317, a passivation layer 318 may be formed on portions of the surface of the second heat-conducting layer 330 and portions of the backside pad layer 317. The passivation layer 318 may be made of any appropriate material, such as silicon oxide, silicon nitride, silicon oxynitride, or epoxy, etc.

Thus, a semiconductor structure may be formed by the disclosed methods and processes. FIG. 13 illustrates a corresponding semiconductor structure.

As shown in FIG. 13, the semiconductor structure includes an insulation material layer 302; and a top semiconductor layer 303 having a plurality of transistor regions (not labeled) on a top surface of the insulation material layer 302. The semiconductor structure may also include gate structures 304 formed on the surface of the top semiconductor layer 303 in the transistor regions; and doping regions 305 formed in the top semiconductor layer 303. Further, the semiconductor structure may also include insulation structures 307 formed in the top semiconductor layer 303 between adjacent transistor regions; and a first dielectric layer 306 formed on the top semiconductor layer 303 and covering the gate structures 304. Further, the semiconductor structure may also include a second stop layer 300 formed on the surface of the first dielectric layer 306; and a second dielectric layer 313 formed on the surface of the second stop layer 300; and an interconnect structure (not labeled) having zeroth conductive vias 311, zeroth conductive layers 312, first conductive vias 331, first conductive layers 324, second conductive vias 321 and second conductive layers 314 formed on the second dielectric layer 313. Further, the semiconductor structure way also include a carrier water 315 bonded on the surface of the second dielectric layer 313; and a second heat-conducting layer 330 formed on the back surface of the insulation material layer 302. Further, the semiconductor structure may also include a bottom layer conductive via 316 penetrating through the second heat-conducting layer 330, the first heat-conducting layer 310 and a partial thickness of the second dielectric layer 313 and electrically connecting with the first conductive layers 324;

a backside pad layer 317 formed on the bottom surface of the second heat-conducting layer 330; and a passivation layer 318 formed on the passivation layer 330 and portions of the surface of the backside pad layer 317. The detailed structures and intermediate structures are described above with respect to the fabrication processes.

Thus, according to the disclose processes and structures, a first opening penetrating through portions of the first dielectric layer, the isolation structure and the insulation material layer between adjacent transistors may be formed; and a first heat-conducting layer may be filled in the first opening. The thermal conductivity of the first heat-conducting layer may be greater than the thermal conductivity of the isolation structure. Thus, when the transistors are in operation, the generated heat may be transferred through the isolation structure and the first heat-conducting layer; and the heat transfer rate may be increased. Accordingly, the over-heating issue inside the semiconductor structure may be avoided. The temperature inside the semiconductor structure may be relatively low; and the electrical properties of the semiconductor structure may be improved.

Further, the width of the first opening may be smaller than the distance between adjacent transistor regions. Along the direction parallel to the surface of the top semiconductor layer, the width of the portion of the isolation structure between the first opening and the adjacent transistor region may be in a range of approximately 0.1 μm-0.4 μm. Besides increasing the heat transfer rate, such a size range may also ensure that the portion of the isolation structure between the first opening and the adjacent transistor region may still have a certain width to prevent an electrical connection between the first heat-conducting layer and the adjacent transistors.

Further, the semiconductor structure may also include a second heat-conducting layer formed on the bottom surface of the insulation material layer. The thermal conductivity of the second heat-conducting layer may be greater than the thermal conductivity of air. The heat transfer rate through the second heat-conducting layer may be greater than the heat transfer rate through the air. Thus, the heat inside the semiconductor structure may be timely transferred to the external environment. Accordingly, the temperature inside the semiconductor structure may be further reduced.

Further, a through hole penetrating through the first heat-conducting layer may be formed; and a bottom layer conductive layer may be formed in the through hole. Thus, the bottom layer conductive via may also penetrating through the first heat-conducting layer. The thermal conductivity of the bottom layer conductive via may be greater than the thermal conductivity of the first heat-conducting layer. Thus, the transfer rate of the heat inside the semiconductor structure to the external environment may be further increased. Thus, the self-heating issue of the semiconductor structure may be further improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A semiconductor structure, comprising:
    an insulation material layer having a top surface and a bottom surface;
    a top semiconductor layer having a plurality of transistor regions formed on the top surface of the insulation material layer;
    isolation structures formed in the top semiconductor layer between adjacent transistor regions;
    a first dielectric layer formed over the top semiconductor layer;
    a first heat-conducting layer, having a thermal conductivity higher than a thermal conductivity of the isolation structures, and passing through the insulation material layer, the isolation structure in the top semiconductor layer, and the first dielectric layer;
    a second dielectric layer formed over the first dielectric layer;
    an interconnect structure formed in the second dielectric layer; and
    a bottom layer conductive via, passing through the first heat-conducting layer and a partial thickness of the second dielectric layer, and electrically connected with the interconnect structure.

2. The semiconductor structure according to claim 1, further comprising:
    gate structures formed on the top semiconductor layer in the transistor regions;
    doping regions formed the in the top semiconductor layer at two sides of the gate structures;
    zeroth conductive vias penetrating through the first dielectric layer formed on the doping regions;
    zeroth conductive layers electrically connected with the zeroth conductive vias formed over the first dielectric layer; and
    a carrier wafer bonded with a top surface of the second dielectric layer,
    wherein the zeroth conductive layers are electrically connected with the zeroth conductive vias.

3. The semiconductor structure according to claim 1, wherein the first heat-conducting layer is formed by:
    forming a first opening passing through the insulation material layer, the top semiconductor layer and the first dielectric layer; and
    filling the first opening with a first heat-conducting film.

4. The semiconductor structure according to claim 3, wherein:
    a width of the first opening is smaller than a distance between the adjacent transistor regions along a direction parallel to a surface of the top semiconductor layer.

5. The semiconductor structure according to claim 3, wherein:
    a width of the isolation structure between the first opening and an adjacent transistor region is in a range of approximately 0.1 μm-0.4 μm.

6. The semiconductor structure according to claim 1, wherein:
    the first heat-conducting layer is made of one of polysilicon and amorphous silicon.

7. The semiconductor structure according to claim 2, further comprising:
    a second heat-conducting layer with a thermal conductivity greater than a thermal conductivity of air formed on the bottom surface of the isolation material layer.

8. The semiconductor structure according to claim 7, wherein:
    the second heat-conducting layer is made of one of polysilicon and amorphous silicon.

9. The semiconductor structure according to claim 2, wherein along a direction perpendicular to a top surface of the top semiconductor layer and directing from the insulation layer to the second dielectric layer, the interconnect structure comprises:
N (N≥2) layers of conductive layers; and
a plurality of $N^{th}$ conductive vias between $(N-1)^{th}$ conductive layers and $N^{th}$ conductive layers,
wherein:
the $N^{th}$ conductive vias electrically connect the $(N-1)^{th}$ conductive layers with the $N^{th}$ conductive layers.

10. The semiconductor structure according to claim 1, further comprising:
a backside pad layer electrically connecting with the bottom layer conductive via formed over the insulation material layer.

11. A method for fabricating a semiconductor structure, comprising:
providing a bottom semiconductor layer, an insulation material layer on the bottom semiconductor layer and a top semiconductor layer having a plurality of transistor regions on the insulation material layer;
forming isolation structures between adjacent transistor regions in the top semiconductor layer;
forming gate structures on the top semiconductor layer in the transistor regions;
forming doping regions in the top semiconductor layer at two sides of the gate structures;
forming a first dielectric layer over the top semiconductor layer;
etching portions of the first dielectric layer, the top semiconductor layer and the insulation material layer between adjacent transistor regions until the bottom semiconductor layer is exposed to form a first opening;
forming a first heat-conducting layer having a thermal conductivity greater than a thermal conductivity of the isolation structure in the first opening; and
forming a bottom layer conductive via, passing through the first heat-conducting layer.

12. The method according to claim 11, further comprising:
forming zeroth conductive vias passing through the first dielectric layer on surfaces of the doping regions;
forming zeroth conductive layers electrically connected with the zeroth conductive vias on a surface of the first dielectric layer;
forming a second dielectric layer over the first dielectric layer;
forming an interconnect structure having top conductive layers and electrically connected with the zeroth conductive layers in the second dielectric layer;
providing a carrier wafer;
bonding the carrier wafer with a top surface of the second dielectric layer and surfaces of the top conductive layers;
removing the bottom semiconductor layer;
etching the insulation material layer from a bottom surface to the top surface to form a through hole to connect with the interconnect structure, wherein
the bottom layer conductive via is formed in the through hole.

13. The method according to claim 11, wherein:
the first heat-conducting layer is made of one of polysilicon and amorphous silicon.

14. The method according to claim 11, wherein forming the first heat-conducting layer comprises:
forming a first heat-conducting film to fill the first opening and on a top surface of the first dielectric layer; and
removing the first heat-conducting film higher than the first dielectric layer.

15. The method according to claim 14, before forming the heat-conducting film, further comprising:
forming a first stop layer on a bottom and side surfaces of the first opening and a top surface of the first dielectric layer; and
removing the first heat-conducting film above the first stop layer to form the first heat-conducting layer,
wherein:
the first stop layer is made of a material different from that of the first dielectric layer; and
the first stop layer is made of a material different from that of the first heat-conducting film.

16. The method according to claim 12, before forming the through hole, further comprising:
forming a second heat-conducting layer on the bottom surface of the insulation material layer,
wherein:
a thermal conductivity of the second heat-conducting layer is greater than a thermal conductivity of air;
the through hole passes through the second heat-conducting layer; and
the second heat-conducting layer is made of one of polysilicon and amorphous silicon.

17. The method according to claim 12, wherein:
a thermal conductivity of the bottom layer conductive via is greater than a thermal conductivity of the first heat-conducting layer.

18. The method according to claim 12, wherein:
the through hole passes through the first heat-conducting layer and the isolation structure.

19. The method according to claim 18, wherein:
a width of the first conducting layer at two sides of the through hole is greater than approximately 0.1 µm.

20. The method according to claim 12, further comprising:
forming a backside pad layer electrically connected with the bottom layer conductive via over the bottom surface of the insulation material layer; and
forming a passivation layer over the bottom surface of the insulation material and portions of the backside pad layer.

* * * * *